(12) United States Patent
Chae et al.

(10) Patent No.: US 6,370,793 B1
(45) Date of Patent: Apr. 16, 2002

(54) APPARATUS FOR CONTROLLING THE TEMPERATURE OF A WAFER LOCATED AT A PRE-ALIGNMENT STAGE

(75) Inventors: Hee Sun Chae, Suwon-Shi; Jae Il Kim; Yo Han Ahn, both of Yongin-Shi, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/584,551

(22) Filed: Jun. 1, 2000

(30) Foreign Application Priority Data

Oct. 23, 1999 (KR) ............................................. 99-46228

(51) Int. Cl.$^7$ .............................................. B65G 49/07
(52) U.S. Cl. ............................. 34/231; 34/566; 414/936
(58) Field of Search ................................. 73/1.75, 1.79; 198/376, 401; 34/566, 580, 527, 75, 231; 414/936

(56) References Cited

U.S. PATENT DOCUMENTS

| | | | |
|---|---|---|---|
| 4,432,635 A | * 2/1984 | Mayer | 355/30 |
| 5,458,687 A | * 10/1995 | Schichida et al. | 118/724 |
| 5,633,698 A | * 5/1997 | Imai | 355/72 |
| 5,725,664 A | * 3/1998 | Nanbu et al. | 118/52 |
| 5,992,046 A | * 11/1999 | Weigand et al. | 34/493 |
| 6,124,601 A | * 9/2000 | Yoshii et al. | 250/559.29 |

FOREIGN PATENT DOCUMENTS

JP          03013842     * 1/1992    ............ G01N/3/08

* cited by examiner

Primary Examiner—Ira S. Lazarus
Assistant Examiner—Greg Warder
(74) Attorney, Agent, or Firm—Volentine Francos, PLLC

(57) ABSTRACT

Apparatus for controlling the temperature of a wafer in a wafer pre-alignment stage has an air injection member for injecting cooling air towards a chucked wafer and an air guide for guiding a predetermined amount of the injected air towards a portion of the wafer adjacent the edge sensor to compensate for a relatively high temperature condition existing at the region of the edge sensor due to the operation thereof. The air injection member is connected with an air supplier and includes an air injection head having a bottom plate through which a plurality of injection holes extend. The air guide is a flow rate controlling plate which is disposed within the air injection head. The air introduced received by the air injection head is guided towards the region of the edge sensor by the flow rate controlling plate. By maintaining the surface temperature of a wafer uniform in the wafer pre-alignment stage, semiconductor device defects otherwise caused by the physical thermal expansion of wafers can be markedly reduced.

30 Claims, 5 Drawing Sheets

APPARATUS FOR CONTROLLING THE TEMPERATURE OF A WAFER LOCATED AT A PRE-ALIGNMENT STAGE

BACKGROUND OF THE INVENTION

1. Field of the Invention

The present invention relates to an apparatus for manufacturing semiconductor devices. More particularly, the present invention relates to a wafer pre-alignment stage and to apparatus for controlling the temperature of a wafer held by a wafer chuck of the pre-alignment stage.

2. Description of the Related Art

Generally, semiconductor devices such as semiconductor chips are manufactured by subjecting a wafer made of silicon to a series of semiconductor manufacturing processes such as lithography, light exposure, ion implantation, chemical and mechanical polishing, chemical and physical vapor deposition, and plasma etching or the like.

The light exposure process typically comprises wafer alignment and UV-light exposure steps. More specifically, a wafer coated with photoresist is positioned on a wafer stage in proper alignment with a mask, and then the wafer is exposed to UV-light to form a photoresist pattern.

Such a light exposure process and attendent apparatus are disclosed in U.S. Pat. No. 5,706,076 (issued to Minoru Takeda on Jan. 6, 1998), U.S. Pat. No. 5,781,277 (issued to Kazunori Iwamoto on Jul. 14, 1998), U.S. Pat. No. 5,526,093 (issued to Kazhiro Takahachi on Jun. 11, 1996), and U.S. Pat. No. 5,842,824 (issued to Kenji Nishi on Dec. 1, 1998).

The wafer alignment process mentioned above generally consists of a wafer pre-alignment step which is carried out on a wafer pre-alignment stage and a main wafer alignment step carried out on a main wafer stage. In the wafer pre-alignment step, the position of a wafer is determined by both an edge sensor which detects the edge of the wafer and by an alignment mark sensor which detects an alignment mark on the wafer.

Once pre-aligned, the wafer is then transferred to the main wafer stage. There, the position of the wafer is accurately detected by a number of minute detecting sensors. The wafer is positioned in final alignment with the mask based on the position detected by the sensors.

FIG. 1 is a schematic-plan view of a conventional light exposure system 500. As shown in FIG. 1, the light exposure system 500 includes a wafer transfer stage 510 for storing a wafer W, a wafer pre-alignient stage 520 for pre-aligning the wafer W transferred by the wafer transfer stage 510, and a main wafer stage 530 for precisely aligning the wafer W transferred from the wafer pre-alignment stage 520. The wafer pre-alignment stage 520 is positioned between the wafer transfer stage 510 and the main wafer stage 530.

The wafer W on the wafer transfer stage 510 is coated with a photoresist. The photoresist coating is performed by a spinner executing a spin-coating method. The wafer W coated with the photoresist is transferred to the wafer transfer stage 510 by a first handler 512 once the coating process is completed.

The wafer pre-alignment stage is provided with second and third handlers 522 and 532. The second handler 522 functions to transfer the wafer W from the wafer transfer stage 510 to the wafer pre-alignment stage 520, and to return the wafer W from the wafer pre-alignment stage 520 to its original position on the wafer transfer stage 510 after the wafer W has been subjected to a light exposure process.

The third handler 532 functions to transfer the wafer W from the wafer pre-alignment stage to the main wafer stage 530, and to return the wafer W at the completion of a light exposure process from the main wafer stage to its original position on the wafer pre-alignment stage 520. A pivotal movement of the third handler 532 over a range of 120 degrees enables the third handler 532 to return the wafer W to its original position on the wafer pre-alignient stage 520.

The wafer pre-alignment stage 520 is also provided with an edge sensor 550 and an alignment mark sensor 560. The edge sensor 550 is used to detect a flat-zone of the wafer W and includes a light emitting device (not shown) and a light receiving device (not shown). Because the alignment mark sensor 560 detects an alignment mark formed on a side portion of the wafer W after the flat-zone has been detected by the edge sensor 550, a fine and accurate pre-alignment can be achieved in the wafer pre-alignment stage 520.

The main wafer stage 530 is provided with a number of light detecting sensors 534 which are used to detect the position of the wafer W on the main wafer stage 530. The detected position is then output to a controller (not shown) which activates a wafer positioning device (not shown) based on the information outputted by the light detecting sensors 534 to finely control the position of the wafer W on the main wafer stage 530. Due to such fine alignment processes carried out by the wafer pre-alignment and wafer main stages, thin films can be formed on the wafer-W without the occurrence of an overaly. Here, the term overlay refers to a case in which a second thin film is deposited on the surface of a first thin film while being offset from its intended overlying position relative thereto.

After being aligned in the main wafer stage 530, the wafer W is exposed to UV-rays radiating from a UV-generating device 536 to form a photoresist pattern on the upper surface of the wafer-W. In this exposure process, a mask is interposed between the photoresist and the UV-generating device 536.

The operation of the conventional light exposure system 500 will now be described in detail.

First, the wafer W coated with a photoresist by the spinner 540 is transferred to the wafer transfer stage 510 by the first handler 512.

The wafer W awaits awaits processing in the wafer transfer stage 510. Once its turn arrives, the wafer W is then transferred to the wafer pre-alignment stage 520 by the second handler 522. The wafer W is placed in the wafer pre-alignment stage 520 in a position between the alignment mark sensor 560 and the edge sensor 550. Subsequently, the wafer W is rotated at a predetermined speed by a rotating device (not shown) until a flat-zone has been detected by the edge sensor 550.

Once the flat-zone has been detected, the alignment mark sensor 560 detects an alignment mark formed on the wafer W. During the detection process, the wafer W is rotated in minute angular increments until the alignment mark has been detected. At the completion of the pre-alignment process, the wafer W is then transferred to the main wafer stage 530 by the third handler 532.

At the main wafer stage 530, the light detecting sensors 534 detect the position of the wafer W. The light detecting sensors 534 are minute sensing devices which continuously send electric signals, corresponding to the position of the wafer W to the controller. Based on the signals received, the controller activates the wafer positioning device to finely adjust the position of the wafer W to a predetermined position on the main wafer stage 530.

After the completion of the aligning process in the main wafer stage 530, the controller sends an electric signal to the UV-generating device 536 commanding the UV-generating device 536 to irradiate the wafer W. In the irradiating process, a mask having a predetermined pattern is interposed between the photoresist and the UV-generating device 536 to cause respective portions of the polymer in the photoresist formed on the upper surface of the wafer W to become soluble and to be left non-soluble.

Then the wafer W is transferred to the wafer pre-alignment stage 520 by the third handler 532. The wafer W is then returned from the wafer pre-alignment stage 520 to its original position on the wafer transfer stage 510 by the second handler 522.

Thereafter, the wafer W is transferred to a subsequent stage to be cleaned with a developer for removing the soluble polymer portion of the photoresist and thereby produce the same pattern that was on the mask.

The conventional light exposure apparatus, such as the light exposure apparatus 500 described above, has a significant drawback in that a relatively high temperature is generated in the wafer pre-alignment stage 520 compared to the wafer transfer stage 510. This causes a physical thermal expansion of the wafer W. Such physical thermal expansion conributes to occurrences of overlay of thin films on the wafer W, in turn creating defects in the resultant semiconductor devices.

More specifically, while the wafer W is on the wafer pre-alignment stage 520, a portion of its outer periphery is surrounded by the edge sensor 550 which conventionally has a temperature of 35° C. With such a relatively high temperature, the edge sensor 550 tends to radiate heat toward a portion of the wafer W. As a result, the temperature of the wafer W becomes uneven over its surface, which non-uniformity in surface temperature can cause an overlay to occur in the thin films deposited on the wafer W.

SUMMARY OF THE INVENTION

In view of the foregoing, it is an object of the present invention to provide apparatus for maintaining a uniform surface temperature condition of a wafer in a wafer pre-alignment stage.

In order to achieve the above object, the present invention provides air injection means for injecting cooling air towards a wafer located at the pre-alignemnt stage, and an air guide for guiding a predetermined amount of the injected air towards a portion of the wafer adjacent the edge sensor to compensate for the relatively high temperature condition existing at that region.

The air injection means is positioned above an upper surface of the wafer and is connected with an air supplier, and includes an air injection head having a plurality of injection holes. The air guide is a flow rate controlling plate which divides the interior of the air injection head into a first space portion and a second space portion, the second space portion being located adjacent, i.e. directly above, the region of the edge sensor. The air introduced into the second space portion is guided towards the edge sensor by the flow rate controlling plate.

The flow rate controlling plate may be fixed in place or may be movable so as to allow the volumes of the first and second space portions to be varied.

An air duct is connected to an air supplier at its proximal end. The distal end of the air duct extends towards the upper surface of the wafer. A neck is formed at the bottom of the distal end of the air duct. The air injection head, in turn, extends from the bottom of the neck. The air injection head has a bottom plate through which the plurality of injection holes extend.

The air injection head is interposed between the edge sensor and the alignment mark sensor and its overall outer shape is that of a cylinder having a diameter larger than that of the wafer which is to be aligned at the stage. The air injection head also has a recessed outer peripheral portion for receiving the alignment mark sensor and a cut-away outer peripheral portion in which the edge sensor is accommodated without contacting the air injection head.

An upper wall portion of the flow rate controlling plate is located inside the neck and divides the interior thereof into two equal regions such that equal amounts of air are introduced through the neck into the first and second space portions. A lower wall portion of the flow rate controlling plate is inclined by a predetermined angle so as to extend in a direction towards the edge sensor, thereby directing the flow of air from s the second space portion towards the region of the edge sensor.

BRIEF DESCRIPTION OF THE DRAWINGS

The above objects and other objects, features and advantages of the present invention will become more apparent by refering to the following detailed description of the preferred embodiments thereof made with reference to the attached drawings, of which.

DETAILED DESCRIPTION OF THE PREFERRED EMBODIMENTS

The preferred embodiments of the present invention will be described in detail hereinafter with reference to the attached drawings.

Figure 1:
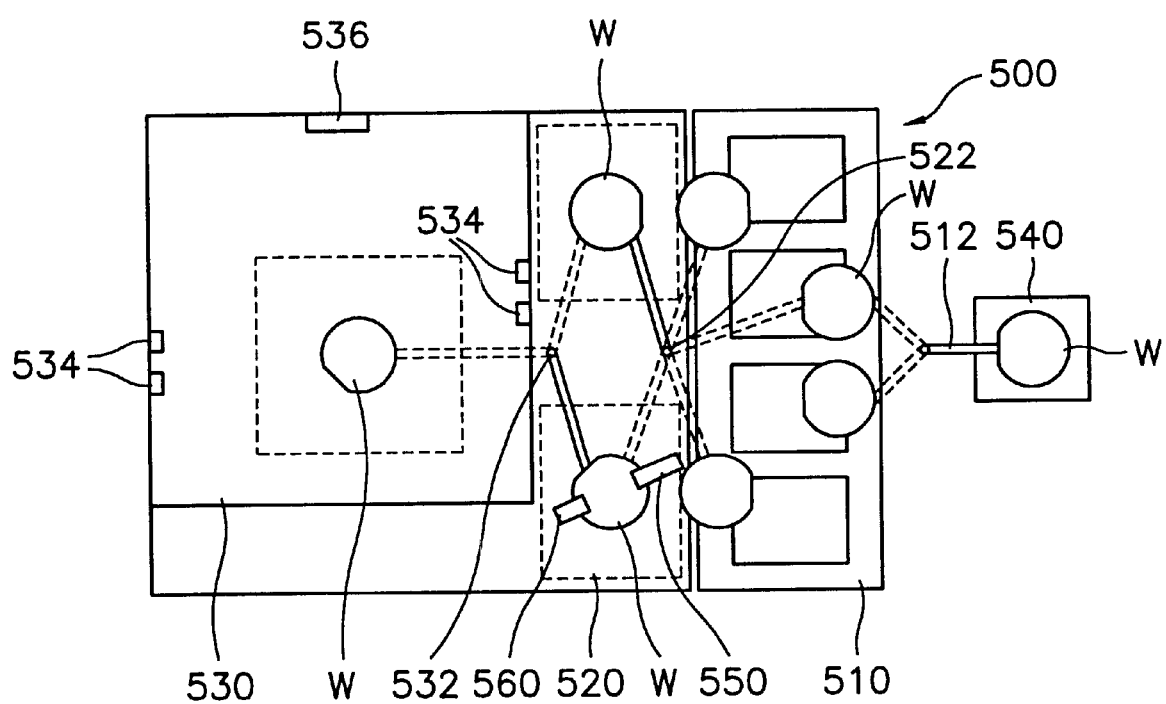
FIG. 1 is a schematic plan view of a conventional light exposure system.
Figure 2:
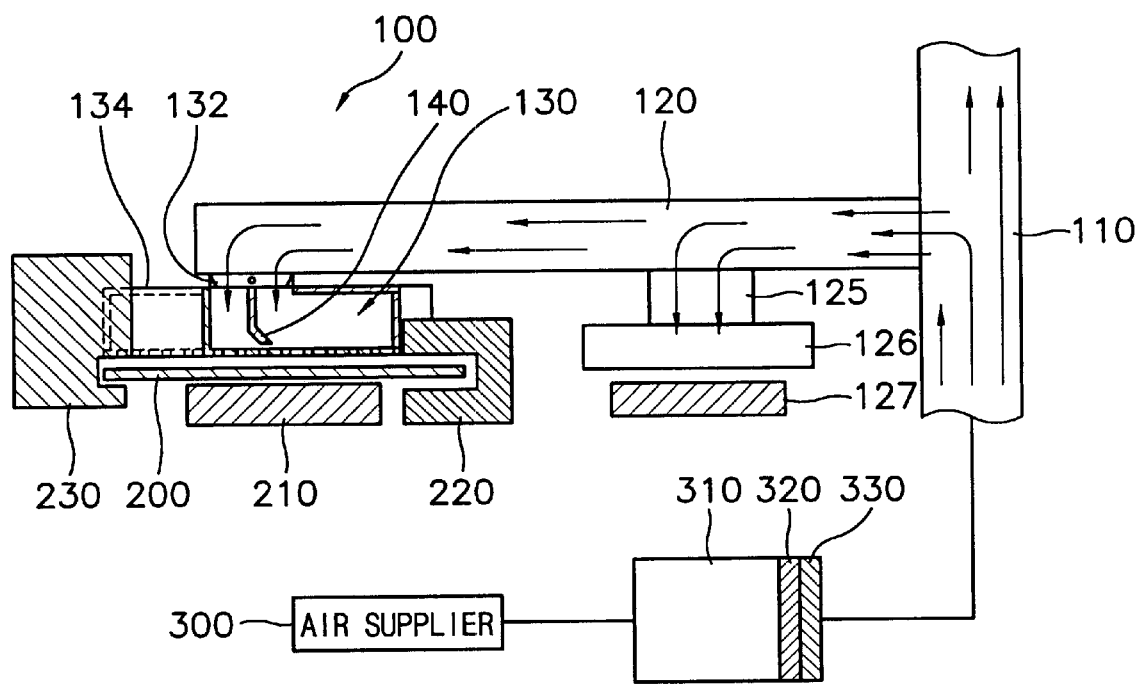
FIG. 2 is a side sectional view of a first preferred embodiment of a temperature controlling apparatus for controlling the temperature of a wafer in a wafer pre-alignment stage according to the present invention.

As shown in FIG. 2, the temperature controlling apparatus 100 includes an air injection head 134 for injecting air towards a wafer 200 positioned between an edge sensor 220 and an alignment mark sensor 230. The wafer 200 is fixedly supported by a wafer fixing chuck 210, and the edge sensor 220 is provided with a light emitting device (not shown) and a light receiving device (not shown) for detecting a flat-zone of the wafer 200.

The air injection head 134 has a space 130 at its interior. A flow rate controlling plate 140 is provided in this space 130 for guiding a predetermined amount of air to a portion of the wafer 200 adjacent the edge sensor 220 so as to compensate for the relatively high temperature condition exisiting at the region of the edge sensor 200. The flow rate controlling plate 140 will be described in detail later.

The air injection head 134 receives air from an air supplier 300. The air is supplied through a first air duct 110 via an air tank 310. The air in the first air duct 110 is introduced to the air injection head 134 via a second air duct 120, which extends to a location above the upper surface of the wafer 200, and via a neck portion 132 extending from the bottom of and integral with the second air duct 120. The neck portion 132 is located at a position off-set by a predetermined distance from the center of air injection head 134 in a direction toward the edge sensor 220 so that a greater amount of air is injected near the edge sensor 220.

Furthermore, a predetermined amount of air in the second air duct 120 is injected towards an upper surface of a wafer withdrawing chuck 127 via a head 126 of a side duct 125 communicating with the second air duct 120. The air injected towards the wafer withdrawing chuck 127 serves to remove foreign substances on a wafer 200 held by the wafer withdrawing chuck 127. Still further, a predetermined amount of air flowing in the first air duct 110 is diverted through an upper portion of the duct 110 and is thereby directed to a wafer stage. In this way, the wafer stage is cooled.

The air tank 310 includes a cooling device 320 for cooling the air supplied to the air injection head 134 and a filter 330 for filtering foreign substances from the air.

Figure 3:
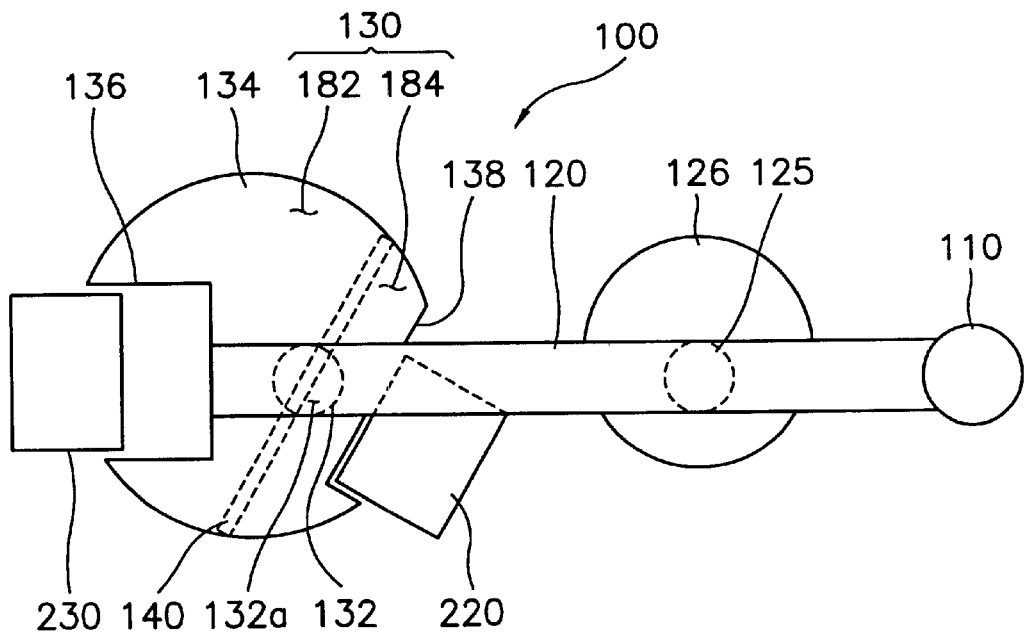
FIG. 3 is a plan view of the temperature controlling apparatus illustrated in FIG. 2.

Referring now to FIG. 3, the general outer shape of the air injection head 134 is that of a cylinder having a diameter larger than that of the wafer 200. Furthermore, the air injection head 134 has a recessed portion 136 in which the alignment mark sensor 230 is received, and a cut-away portion 138 accommodating the edge sensor 220 without being in contact with the same. The locations of the recessed portion 136 and the cut-away portion 138 may vary according to the positions of the alignment mark sensor 230 and the edge sensor 220.

The flow rate controlling plate 140 divides the interior space 130 of the air injection head 134 into a first space portion 182 adjacent the alignment mark sensor 230 and a second space portion 184 adjacent the edge sensor 220. The first space portion 182 has a volume greater than that of the second space portion 184, and air introduced into the second space portion 184 is injected toward the region of the edge sensor 220 by the flow rate controlling plate 140.

An upper end portion of the flow rate controlling plate 140 is fixed to the neck portion 132 and divides an air flow path 132A defined by the interior of the neck portion 132 into two discrete flow paths from which equal amounts of air flow into the first and second space portions 182 and 184, respectively. However, since the first space portion 182 has a volume greater than that of the second space portion 184, the air injected towards the region of the edge sensor 220 via the second space portion 184 has a relatively high flow rate compared to that injected via the first space portion 182.

Figure 4:
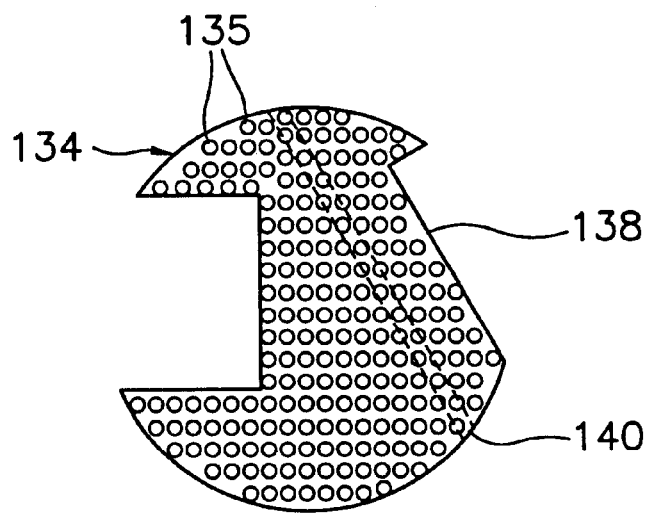
FIG. 4 is a bottom view of an air injection head of the first preferred embodiment of the present invention.

FIG. 4 shows the bottom of the air injection head 134 of the first preferred embodiment of the present invention. As can be seen in this figure, a plurality of injection holes 135 are uniformly distributed in the bottom plate of the air injection head 134. The injection holes 135 are shown as having a circular cross section, but they may have rectangular or pentagonal cross-sectional shapes.

Figure 5:
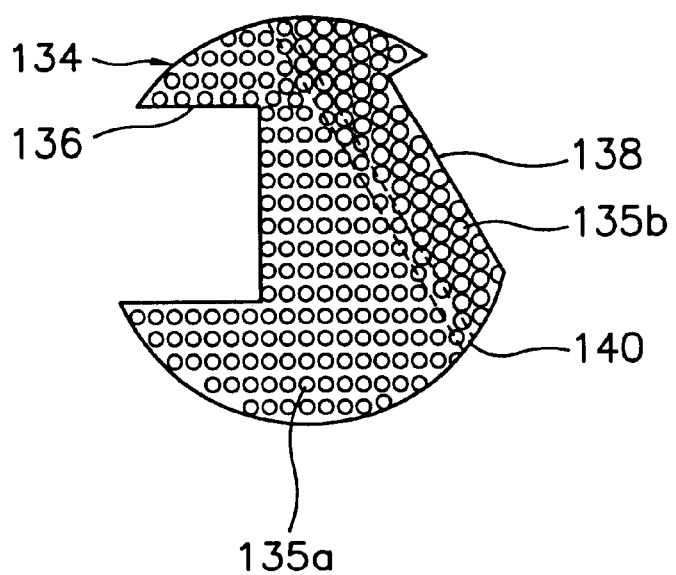
FIG. 5 is a bottom view of an air injection head of a second embodiment of the temperature controlling apparatus according to the present invention.

FIG. 5 is a bottom view of an air injection head 134 of a second preferred embodiment of the present invention. According to this embodiment, the air injection head 134 has a first group of injection holes 135A of a first size and a second group of injection holes 135B of a second size larger than the first. The first group of the injections holes 135A is located adjacent the align mark sensor 230 and the second group of the injection holes 135B is located adjacent the edge sensor 220.

The injection holes 135B of the second group are more densely distributed than the injection holes 135A of the first group. Accordingly, more air is injected towards the edge sensor 220 via the second group of the injection holes 135B than towards the alignment mark sensor 230 via the first group of the injection holes 135A.

Figure 7:
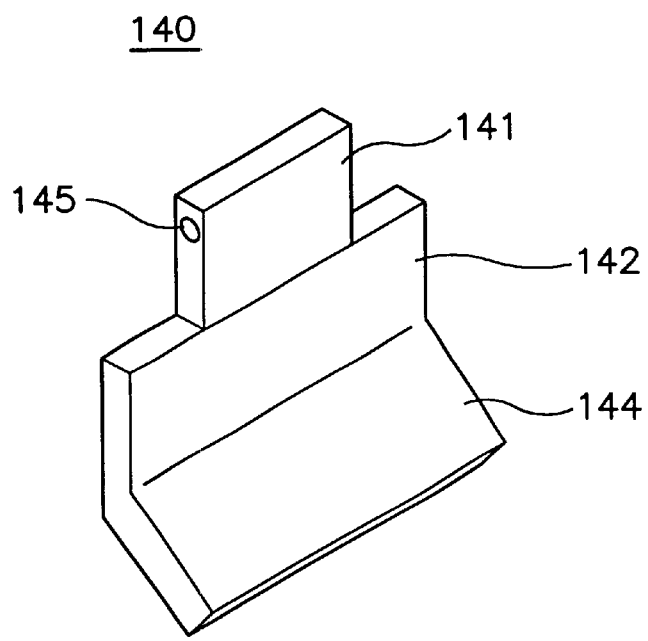
FIG. 7 is a perspective view of the flow rate controlling plate of the present invention.

FIG. 7 shows the structure of the flow rate controlling plate 140 in detail. Referring to FIGS. 2 and 7, the flow rate controlling plate 140 includes a head (upper) wall portion 141 fixed to the neck portion 132 within the flow path 132a defined therein (inlet) so as to divide the flow path 132a into two discrete paths, an isolating (middle) wall portion 142 integral with the head portion 141 and extending from the bottom thereof into the interior space 130 of the air injection head 134, and an inclined (bottom) wall portion 144 integral with the bottom of the isolating wall portion 142 and angled therefrom toward the edge sensor 220 so as to direct air from the second space portion 184 towards the region of the edge sensor 220.

As described earlier, equal amounts of air are respectively introduced to both the first and second space portions 182 and 184 by the head portion 141 which divides the path 132a of the neck portion into two equal regions.

Figure 6:
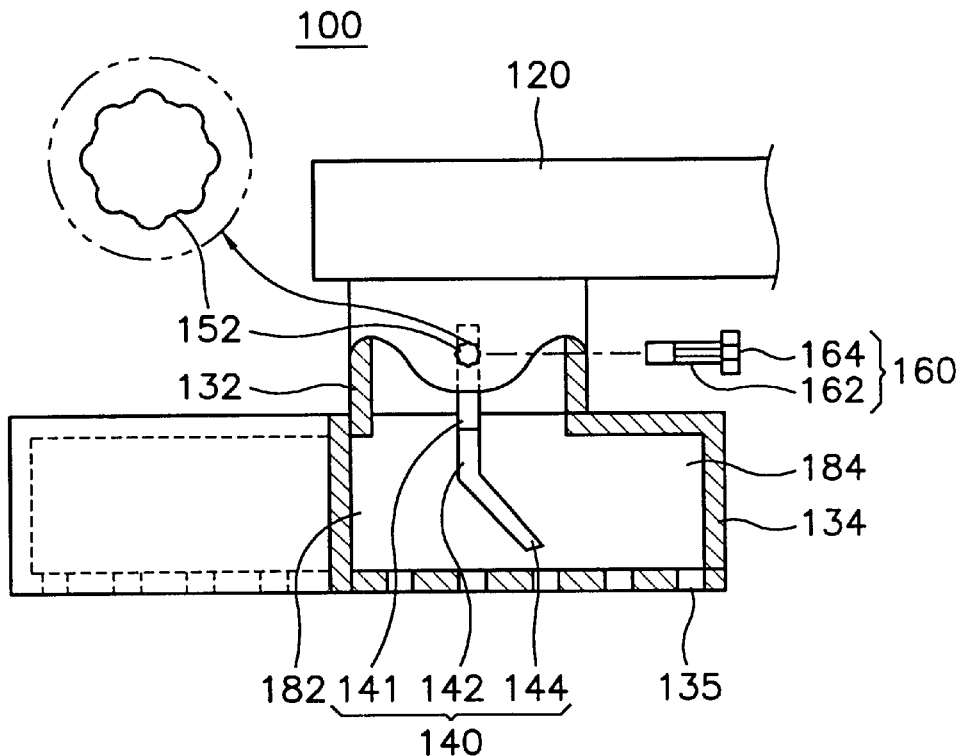
FIG. 6 is a schematic diagram of the temeprature control apparatus according to the present invention, showing one embodiment of a flow rate controlling plate attached to a neck portion of the air injection head.
Figure 8:
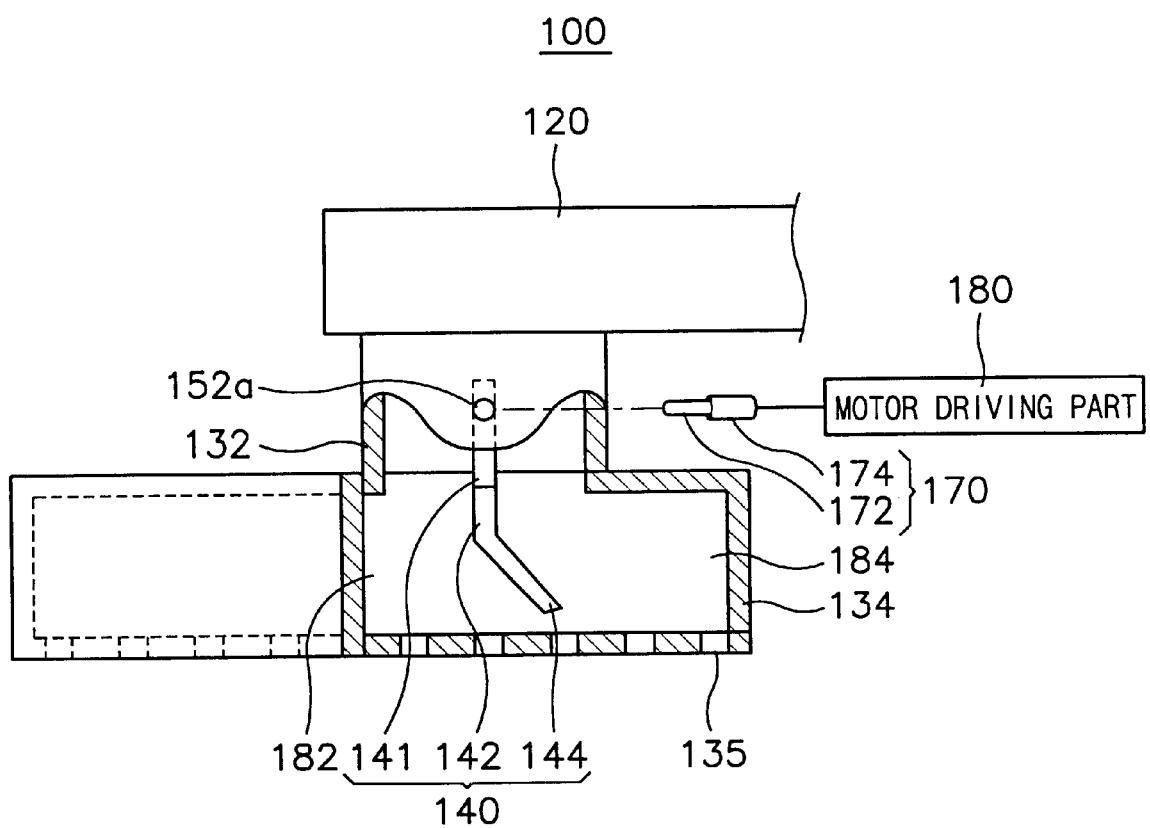
FIG. 8 is a schematic diagram of the temeprature control apparatus according to the present invention, showing another embodiment of a flow rate controlling plate attached to a neck portion of the air injection head.

FIGS. 6 and 8 illustrate another preferred embodiment of the present invention in which the upper end portion of the flow rate controlling plate 140 is pivotally mounted to the neck portion 132 so that the amount of air introduced to the first and second space portions 182 and 184 can be varied.

That is, the head portion 141 in this embodiment is pivotally mounted to a side wall of the neck portion 132. Pivoting the flow rate controlling plate 140 via the head portion 141 thereof causes differing amounts of air to be introduced into the first space portion 182 and the second space portion 184.

FIG. 6 shows one form of the flow rate controlling plate 140. In this embodiment, the flow rate controlling plate 140 is pivotally mounted to the neck portion 132 of the air injection head 134 by a spline assembly 160. The spline assembly 160 includes a splined shaft 162 and a rotating cap 164 integral with an end portion of the splined shaft 162. Also as shown in FIG. 6, the side wall of the neck portion 132 has a splined hole 152 which receives the splined shaft 162.

FIG. 7 shows that the side of the head portion 141 of the flow rate controlling plate 140 has a though-hole 145 which receives an end portion of the splined shaft 162. The splined shaft 162 is press-fitted to the flow rate controlling plate 142 via the though-hole 145. The material of the splined shaft 162 is sufficiently resilient to allow it to engage the neck portion 132 within the splined hole 152 and yet rotate relative thereto to a new engaged position. In this way, the flow rate controlling plate 140 can be pivoted by turning the rotating cap 164 to 'click' the splined shaft 162 to a new position within hole 152, thereby varying the effective volumes of the first and second space portions 182 and 184.

FIG. 8 shows an embodiment in which the flow rate controlling plate 140 is pivotally mounted to the neck portion 132 of the air injection head 134. In this case, a motor assembly 170 is used to rotate the flow rate controlling plate 140. The motor assembly 170 includes a motor shaft 172 and a motor 174 which is operated by a motor driving part 180. The motor 174 is preferably a stepper motor rotatable in clockwise and counter-clockwise directions.

As shown in FIG. 8, the side of the neck portion 132 has an insertion hole 152a having a circular cross section. An end of the motor shaft 172 is press-fitted to the flow rate controlling plate 140 via the insertion hole 152a. Operating the motor 174 causes the flow rate controlling plate 140 to pivot within the interior space 130 of the injection head 134 to thereby vary the effective volumes of the first and second space portions 182 and 184.

The operation of the temperature controlling apparatus 100 according to the present invention will now be described in detail.

First, when the wafer 200 is transferred from a transfer stage to a position between the alignment mark sensor 230 and the edge sensor 220 of a wafer pre-alignment stage, air is supplied to the air tank 310 from the air supplier 300. The air in the air tank 310 is cooled to a predetermined temperature while passing through the cooling device 320, and then the air is filtered by the air filter 330 so that foreign substances are removed from the air.

Thereafter, the air flows to the second air duct 120 via the first air duct 110. A predetermined amount of the air is directed through the upper portion of the first air duct 110 towards a wafer stage and through the side duct 125 towards the wafer withdrawing chuck 127. The remainder of the air in the second air duct 120 is then introduced into the air injection head 134 though the neck portion 132 formed at the bottom of the distal end of the second air duct 120.

There, the air flows into the first and second space portions 182 and 184 in respective amounts dictated by the flow rate controlling plate 140. The air entering the first space portion 182 is then injected towards a portion of the wafer 200 adjacent the alignment mark sensor 230. On the other hand, the air entering the second space portion 184 is then injected towards a portion of the wafer 200 adjacent the edge sensor 220 and thereby cools a region of the wafer 200 which includes the flat-zone thereof.

The flow rate controlling plate 140 can be pivoted during operation to control the amount of air injected towards the region of the edge sensor 220 such that a stable and uniform temperature of the wafer 200 is maintained. Therefore, as mentioned above, the temperature controlling apparatus of the present invention can prevent defects otherwise caused by physical thermal expansion of the wafer positioned at a pre-alignment stage.

That is, the temperature controlling apparatus compensates for the relatively high temperature condition existing at the edge sensor by focusing cool air onto the portion of the wafer located at that region. The wafer thus exhibits a uniform surface temperature prior to being transferred to a main wafer stage of the exposure apparatus. The present invention thus enhances the quality of semiconductor devices produced as a result of the light exposure process.

Although the present invention has been shown and described with reference to particular embodiments thereof, various changes in form and details apparent to those skilled in the art may be effected therein without departing from the spirit and scope of the invention as defined by the appended claims.

What is claimed is:

1. The combination of a wafer pre-alignment stage, and temperature controlling apparatus for controlling the temperature of a wafer transferred to the stage, said combination comprising:

a rotary wafer chuck; an edge sensor, adjacent one peripheral portion of the wafer chuck, so as to sense for a peripheral edge feature of a wafer held by said chuck;

an air supplier;

an air injection head disposed above said chuck and connected to said air supplier so as to receive air therefrom, said air injection head being having an interior space and including a bottom plate having a plurality of injection holes extending therthrough in open communication with said interior space so as to inject air received from said air supplier towards a wafer held by said chuck; and a flow rate controlling plate disposed in said interior space and dividing the space into a first space portion and a second space portion, the second space portion being adjacent the region of the edge sensor and the first space portion being remote from the region of the edge sensor, the flow rate controlling plate regulating the amounts of air introduced from the air supplier into said first and second space portions, respectively, so as to guide a predetermined amount of the air to the region of the edge sensor, whereby the air guided by the flow rate controlling plate will flow towards a portion of a chucked wafer adjacent the edge sensor to thereby cool the portion of the wafer and compensate for a relatively high temperature condition created at the region of the edge sensor by the operation of the edge sensor.

2. The combination of a wafer pre-alignment stage and temperature controlling apparatus as claimed in claim 1, wherein all of the injection holes extending through said bottom plate are uniformly distributed across the plate and have the same size.

3. The combination of a wafer pre-alignment stage and temperature controlling apparatus as claimed in claim 1, and further comprising an inlet through which air from the air supplier flows into the interior space of the head, said flow rate controlling plate extending into said inlet, and said flow rate controlling plate being movably mounted to said air injection head so as to be movable in the inlet and interior space of the air injection head, movement of said flow rate controlling plate varying the amounts of air feeding through said inlet into the first and second space portions, respectively, whereby different amounts of air can be injected from the air injection head towards the region of the edge sensor.

4. The combination of a wafer pre-alignment stage and temperature controlling apparatus as claimed in claim 2, wherein the first space portion has a volume greater than that of the second space portion such that air flows from the second space portion out of the air injection head at a rate greater a than that at which air flows from the first space portion.

5. The combination of a wafer pre-alignment stage and temperature controlling apparatus as claimed in claim 4, wherein the flow rate controlling plate is fixed in place in the air injection head.

6. The combination of a wafer pre-alignment stage and temperature controlling apparatus as claimed in claim 1, wherein said bottom plate has first and second groups of said injection holes extending therethrough in communication with said first and second space portions, respectively, the injection holes of said second group being larger than those of said first group, and the second group of injection holes being disposed closer to the region of the edge sensor than the first group of injection holes.

7. The combination of a wafer pre-alignment stage and temperature controlling apparatus as claimed in claim 6, wherein the injection holes of said second group are distributed across the bottom plate of the air injection head in a denser arrangement than the injection holes of said first group.

8. The combination of a wafer pre-alignment stage and temperature controlling apparatus as claimed in claim 6, and further comprising an inlet through which air from the air supplier flows into the interior space of the head, said flow rate controlling plate extending into said inlet, and said flow rate controlling plate being movably mounted to said air injection head so as to be movable in the inlet, movement of said flow rate controlling plate varying the amounts of air feeding through said inlet into the first and second space portions, respectively.

9. The combination of a wafer pre-alignment stage and temperature controlling apparatus as claimed in claim 1, and further comprising an air duct having one end connected to said air supplier and a distal end terminating at a location over the wafer chuck, a neck extending from the bottom of the distal end of the air duct to said air injection head and integral therewith, interiors of the air duct, the neck and the air injection head being in open flow communication with each other.

10. The combination of a wafer pre-alignnment stage and temperature controlling apparatus as claimed in claim 9, wherein said air injection head has an overall outer cylindrical shape and a cut-away outer peripheral portion, the edge sensor being accommodated in said cut-away outer peripheral portion of said air injection head in a non-contacting manner.

11. The combination of a wafer pre-alignment stage and temperature controlling apparatus as claimed in claim 9, wherein said first space portion has a volume greater than that of the second space portion, and the flow rate controlling plate has an upper wall portion fixed in place within said neck and dividing the interior therof into two equal regions communicating with said first and second space portions, respectively, whereby equal amounts of air flow from said duct into the first and second space portions.

12. The combination of a wafer pre-alignment stage and temperature controlling apparatus as claimed in claim 11, wherein said flow rate controlling plate has a middle wall portion extending downwardly from said upper wall portion into the interior space of said air injection head, and a lower portion subtending a predetermined angle with said middle wall portion and extending therefrom at an inclination toward said edge sensor to thereby guide air from the second space portion towards the region of the edge sensor.

13. The combination of a wafer pre-alignment stage and temperature controlling apparatus as claimed in claim 9, wherein said flow rate controlling plate includes an upper wall portion extending within said neck, a middle wall portion extending downwardly from said upper wall portion and dividing the interior space of the air injection head into said first space portion remote from the region of the edge sensor and said second space portion adjacent the region of the edge sensor, and a lower portion subtending a predetermined angle with said middle wall portion and extending therefrom at an inclination toward said edge sensor to thereby guide air from the second space portion towards the region of the edge sensor, and said flow rate controlling plate is pivotally mounted in the temperature controlling apparatus such that movement of said flow rate controlling plate varies the amounts of air feeding through said neck into the first and second space portions, respectively.

14. The combination of a wafer pre-alignment stage and temperature controlling apparatus as claimed in claim 3, wherein the upper wall portion of said flow rate controlling plate is pivotally connected to a side wall of said neck.

15. The combination of a wafer pre-alignment stage and temperature controlling apparatus as claimed in claim 4, wherein the side wall of said neck portion has a splined hole extending therethrough, said upper wall portion of the flow rate controlling plate has a hole extending laterally therein, and further comprising a splined shaft extending through said splined hole in said neck and press-fitted to said flow rate controlling plate via said hole therein, and a cap integral with an end portion of the splined shaft protruding from said neck, rotation of said cap causing said flow rate controlling plate to pivot about the longitudinal axis of said splined shaft.

16. The combination of a wafer pre-alignment stage and temperature controlling apparatus as claimed in claim 4, wherein the side wall of said neck has a though-hole, said upper wall portion of the flow rate has a hole extending laterally therein, and further comprising a shaft passing freely through said through-hole and press-fitted to said flow rate controlling plate via said hole therein, and a motor integral with said shaft for rotating the shaft.

17. The combination of a wafer pre-alignment stage and temperature controlling apparatus as claimed in claim 16, wherein the motor is a stepper motor capable of rotating said shaft in clockwise and counter-clockwise directions.

18. The combination of a wafer pre-alignment stage and temperature controlling apparatus as claimed in claim 9, wherein said neck is off-set a predetermined distance from a center of the air injection head in a direction towards said edge sensor.

19. The combination of a wafer pre-alignment stage and temperature controlling apparatus as claimed in claim 1, and further comprising an alignment mark sensor, disposed adjacent another peripheral portion of said wafer chuck, so as to sense the position of an alignment mark of a wafer realtive to a predetermined position.

20. The combination of a wafer pre-alignment stage, and temperature controlling apparatus for controlling the temperature of a wafer transferred to the stage, said combination comprising:

a rotary wafer chuck;

an edge sensor, adjacent one peripheral portion of the wafer chuck, so as to sense for a peripheral edge feature of a wafer held by said chuck;

an air supplier;

an air duct having one end connected to said air supplier and a distal end terminating at a location over the wafer chuck;

an air injection head disposed above said chuck;

a neck extending from the bottom of the distal end of the air duct to said air injection head and integral therewith, interiors of the air duct, the neck and the air injection head being in open flow communication with each other such that said air injection head receives air form said air supplier and injects the received air towards a wafer held by said chuck; and a flow rate controlling plate disposed in said interior space and dividing the space into a first space portion and a second space portion, the second space portion being adjacent the region of the edge sensor and the first space portion being remote from the region of the edge sensor, the flow rate controlling plate regulating the amounts of air introduced from the air supplier into said first and second space portions, respectively, so as to guide a predetermined amount of the air to the region of the edge sensor, whereby the air guided by the flow rate controlling plate will flow towards a portion of a chucked wafer adjacent the edge sensor to thereby cool the portion of the wafer and compensate for a relatively high temperature condition created at the region of the edge sensor by the operation of the edge sensor.

21. The combination of a wafer pre-alignment stage and temperature controlling apparatus as claimed in claim 20, wherein said air injection head has an overall outer cylindrical shape and a cut-away outer peripheral portion, the edge sensor being accommodated in said cut-away outer peripheral portion of said air injection head in a non-contacting manner.

22. The combination of a wafer pre-alignment stage and temperature controlling apparatus as claimed in claim 20, wherein said flow rate controlling plate extends in the air injection head and divides an interior space of the air injection head into a first space portion remote from the region of said edge sensor and a second space portion adjacent the region of said edge sensor, the first space portion having a volume greater than that of the second space portion, and the flow rate controlling plate having an upper wall portion fixed in place within said neck and dividing the interior therof into two equal regions communicating with said space portions, respectively, whereby equal amounts of air flow from said duct into the first and second space portions.

23. The combination of a wafer pre-alignment stage and temperature controlling apparatus as claimed in claim 22, wherein said flow rate controlling plate has a middle wall portion extending downwardly from said upper wall portion into the interior space of said air injection head, and a lower portion subtending a predetermined angle with said middle wall portion and extending therefrom at an inclination toward said edge sensor to thereby guide air from the second space portion towards the region of the edge sensor.

24. The combination of a wafer pre-alignment stage and temperature controlling apparatus as claimed in claim 20, wherein said flow rate controlling plate includes an upper wall portion extending within said neck, a middle wall portion extending downwardly from said upper wall portion and dividing the interior space of the air injection head into a first space portion remote from the region of the edge sensor and a second space portion adjacent the region of the edge sensor, and a lower portion subtending a predetermined angle with said middle wall portion and extending therefrom at an inclination toward said edge sensor to thereby guide air from the second space portion towards the region of the edge sensor, and said flow rate controlling plate being pivotally mounted in the temperature controlling apparatus such that movement of said flow rate controlling plate varies the amounts of air feeding through said neck into the first and second space portions, respectively.

25. The combination of a wafer pre-alignment stage and temperature controlling apparatus as claimed in claim 24, wherein the upper wall portion of said flow rate controlling plate is pivotally connected to a side wall of said neck.

26. The combination of a wafer pre-alignment stage and temperature controlling apparatus as claimed in claim 25, wherein the side wall of said neck portion has a splined hole extending therethrough, said upper wall portion of the flow rate controlling plate has a hole extending laterally therein, and further comprising a splined shaft extending through said splined hole in said neck and press-fitted to said flow rate controlling plate via said hole therein, and a cap integral with an end portion of the splined shaft protruding from said neck, rotation of said cap causing said flow rate controlling plate to pivot about the longitudinal axis of said splined shaft.

27. The combination of a wafer pre-alignment stage and temperature controlling apparatus as claimed in claim 25, wherein the side wall of said neck has a though-hole, said upper wall portion of the flow rate has a hole extending laterally therein, and further comprising a shaft passing freely through said through-hole and press-fitted to said flow rate controlling plate via said hole therein, and a motor integral with said shaft for rotating the shaft.

28. The combination of a wafer pre-alignment stage and temperature controlling apparatus as claimed in claim 27, wherein the motor is a stepper motor capable of rotating said shaft in clockwise and counter-clockwise directions.

29. The combination of a wafer pre-alignment stage and temperature controlling apparatus as claimed in claim 20, wherein said neck is off-set a predetermined distance from a center of the air injection head in a direction towards said edge sensor.

30. The combination of a wafer pre-alignment stage, and temperature controlling apparatus for controlling the temperature of a wafer transferred to the stage, said combination comprising:

a rotary wafer chuck;

an edge sensor, adjacent one peripheral portion of the wafer chuck, so as to sense for a peripheral edge feature of a wafer held by said chuck;

an alignment mark sensor, disposed adjacent another peripheral portion of said wafer chuck, so as to sense the position of an alignment mark of a wafer realtive to a predetermined position;

an air supplier;

an air injection head connected to said air supplier so as to receive air therefrom, said air injection head being oriented relative to said chuck so as to inject air received from said air supplier towards a wafer held by said chuck; and a flow rate controlling plate positioned relative to said air injection head so as to guide a predetermined amount of the air, injected by said air injection head, to the region of the edge sensor, whereby the air guided by the flow rate controlling plate will flow towards a portion of a chucked wafer adjacent the edge sensor to thereby cool the portion of the wafer and compensate for a relatively high temperature condition created at the region of the edge sensor by the operation of the edge sensor.

* * * * *